United States Patent [19]

Nagasawa et al.

[11] E Re. 31,079

[45] Reissued Nov. 16, 1982

[54] METHOD FOR MANUFACTURING COMPLEMENTARY INSULATED GATE FIELD EFFECT TRANSISTORS

[75] Inventors: Kouichi Nagasawa, Kunitachi; Yasunobu Kosa; Satoshi Meguro, both of Kodaira, all of Japan

[73] Assignee: Hitachi, Ltd., Tokyo, Japan

[21] Appl. No.: 182,775

[22] Filed: Aug. 29, 1980

Related U.S. Patent Documents

Reissue of:

[64] Patent No.: 4,110,899
Issued: Sep. 5, 1978
Appl. No.: 756,711
Filed: Jan. 4, 1977

[30] Foreign Application Priority Data

Jan. 12, 1976 [JP] Japan ..... 51-2057

[51] Int. Cl.[3] ..... H01L 21/26

[52] U.S. Cl. ..... 29/571; 29/576 B; 148/187

[58] Field of Search ..... 29/571, 576 B; 357/23, 357/41, 42, 50; 148/1.5, 187

[56] References Cited

U.S. PATENT DOCUMENTS

| | | | |
|---|---|---|---|
| 3,712,995 | 1/1973 | Steudel | 307/304 |
| 3,750,268 | 8/1973 | Wang | 148/187 X |
| 3,853,633 | 12/1974 | Armstrong | 148/1.5 |
| 3,913,211 | 10/1975 | Seeds et al. | 29/571 |
| 3,920,481 | 11/1975 | Hu | 148/187 |
| 3,983,620 | 10/1976 | Spadea | 29/571 |
| 4,013,484 | 3/1977 | Boleky et al. | 148/187 X |
| 4,027,380 | 6/1977 | Deal et al. | 29/571 |
| 4,047,284 | 9/1977 | Spadea | 29/571 |

FOREIGN PATENT DOCUMENTS 7107805 12/1972 Netherlands .

OTHER PUBLICATIONS

*Elektronik-Anzeiger,* vol. 6, No. 2, (1974), pp. 27–30.
*Microelectronics and Reliability,* Pergamon Press, Gt. Britain, vol. 10, 1971, pp. 471 and 472 and 4 pages drawings.
*Philips Res. Repts.,* vol. 26, pp. 166–180, 1971.
*IEEE Trans. on Electron Devices,* vol. ED-21, No. 6, Jun. 1974, pp. 324–331.
*Electronics,* vol. 44, pp. 9E and 10E, 1971.
*Nikkei Electronics,* Japan, Oct. 20, 1975, pp. 26–29.

*Primary Examiner*—G. Ozaki
*Attorney, Agent, or Firm*—Antonelli, Terry & Wands

[57] ABSTRACT

Method for manufacturing *semiconductor devices including, e.g.,* complementary insulated gate field effect transistors of LOCOS (local oxidation of silicon) structure wherein after the formation of a well layer, an impurity having higher doping level than and the same conductivity type as a semiconductor substrate (well layer) is ion implanted at an area in the semiconductor substrate on which a field oxide layer is to be formed using *an oxidation-resistive material, e.g.* a silicon nitride layer, as a mask, and the semiconductor substrate surface is selectively thermally oxidized using the silicon nitride layer as a mask.

29 Claims, 6 Drawing Figures

METHOD FOR MANUFACTURING COMPLEMENTARY INSULATED GATE FIELD EFFECT TRANSISTORS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method for manufacturing complementary insulated gate field effect transistors (hereinafter referred to as CMIS FET's) having a field oxide layer of LOCOS (local oxidation of silicon) structure, and more particularly to a method for manufacturing a semiconductor integrated circuit device comprising such transistors.

2. Description of the Prior Art

In prior art CMIS FET's of the LOCOS structure, a power supply voltage therefor is determined by a threshold voltage $V_{th}$ of an active region which is a channel region immediately beneath a gate electrode and a threshold voltage $V_{th}$ of a parastic MOS FET in a field oxide layer region. Accordingly, when it is desired to raise the power supply voltage for the CMIS FET's, it is necessary to change the impurity concentration of a substrate and the impurity concentration of a well layer which is of opposite conductivity type to that of the substrate. Namely, the threshold voltage $V_{th}$ is defined by $$V_{th} = \frac{Q_\phi + Q_b}{C_g} \quad (1)$$

where $Q_b$ is a charge in a bulk, $Q_{ss}$ is surface state and oxide charge, and $C_g$ is the capacitance of the gate. A simple way to control the threshold voltage $V_{th}$ defined by the equation (1) is to control $Q_b$. That is, $Q_b$ is related to the impurity concentration of the substrate and it increases as the impurity concentration of the substrate increases. Accordingly, $V_{th}$ can be increased by increasing the impurity concentration of the substrate.

Thus, when it is desired to raise the operation voltage, a voltage applied to a wiring layer extending over the field oxidation region also rises, resulting in a parastic channel immediately beneath the field oxide layer region. That is, a parastic MOS FET is formed. In order to avoid the formation of such a parastic MOS FET, it is necessary to increase the impurity concentration of the substrate or the impurity concentration of the well layer as seen from the above equation to raise the threshold voltage $V_{th}$ of the parastic MOS FET. However, since the impurity concentrations of the substrate and the well layer are determined by electrical characteristics of the CMIS FET's such as the threshold voltage $V_{th}$ and mutual conductance gm, the range of the operating voltage for the CMIS FET's is limited and the magnitude thereof is very small. For example, when the threshold voltage $V_{th}$ of an N-channel MOS FET formed in a P-type well layer is 0.45 volts, a parastic channel is formed at about 4 volts because an N-type inversion layer is readily formed because of many sodium (+) ions present in the field oxide layer. As a result, the operating voltage should be up to about 3 volts.

As a commonly used method for manufacturing the CMIS FET's of the LOCOS structure which avoids the formation of the parastic channel in the P-type well layer and which can be practiced in a simple way, a technique disclosed in the Philips Technical Review, Vol. 34, No. 1, 1974, pp. 19–23, is known. According to the technique disclosed therein, particularly in the right column on page 20 and FIG. 2 on page 21, the P-type well layer is formed by ion implantation technology after the formation of the LOCOS oxide (field oxide) layer. Therefore, while the parastic channel is not readily formed, a complex design of layout for the MOS FET's and the wiring layers therefor is required when a plurality of MOS FET's are to be incorporated in the P-type well layer because LOCOS oxides cannot be formed in the P-type well layer. The operating voltage is also limited. That is, according to the disclosed technique, the operating supply voltage should be up to about 10 volts because as the operating voltage rises, the area immediately beneath the LOCOS oxide formed in the semiconductor body is more apt to form a parastic channel by a wiring layer extending over the LOCOS oxide layer although the above area is made more N-type conductive by sodium (+) ions present in the LOCOS oxide. Furthermore, due to the threshold voltage $V_{th}$ of the active region in the P-type well layer, it becomes impossible to prevent the formation of the parastic channel in the P-type well as the operating voltage rises. Accordingly, the field of application of the semiconductor integrated circuit device manufactured by the disclosed technique is limited.

On the other hand, the field of application of the semiconductor integrated circuit device comprising CMIS FET's is wide in these days and, actually, the operating voltage therefor varies widely depending on the specification of a particular product. It is, therefor, required to manufacture CMIS FET's applicable to a variety of products of various specifications in a common process and provide (CMIS FET's which are satisfactorily operable with a wide range of operating voltages. To this end, a method for manufacturing CMIS FET's which can control the threshold voltage $V_{th}$ of the active region of the CMIS FET's and the threshold voltage $V_{th}$ of the parastic MOS FET to predetermined voltages is required.

SUMMARY OF THE INVENTION

It is an object of the present invention to provide a method for manufacturing CMIS FET's of LOCOS structure which allows the establishment of the threshold voltage $V_{th}$ of the parastic MOS FET in the field oxide layer region independently of the threshold voltage $V_{th}$ of the active region whereby the operating voltage can be raised and the range thereof can be widened.

It is another object of the present invention to provide a method for manufacturing CMIS FET's of LOCOS structure suited for a semiconductor integrated circuit device comprising a number of CMIS FET's of LOCOS structure.

It is another object of the present invention to provide a method for manufacturing CMIS FET's of LOCOS structure suited for a semiconductor integrated circuit device operating at a high supply voltage.

It is another object of the present invention to provide a method for manufacturing CMIS FET's of LOCOS structure having less crystal defects.

It is another object of the present invention to provide a method for manufacturing CMIS FET's of LOCOS structure which allows a high integration density.

It is another object of the present invention to provide a method for manufacturing CMIS FET's of LOCOS structure which is less influenced by contamination.

In order to achieve the above objects, the method of manufacturing the CMIS FET's of the LOCOS structure according to the present invention comprises the following steps of:

(1) forming a P(or N)-type well layer in a portion of an N(or P)-type semiconductor substrate surface and then forming a thin thermal oxidation layer over the entire surface and then forming a silicon nitride layer over the entire surface thereof, (2) etching away the silicon nitride layer at areas on which field oxide layers are to be formed, (3) ion implanting donor (or acceptor) and acceptor (or donor) impurities at those areas in the N(or P)-type semiconductor substrate and the P(or N)-type well layer on which the field oxide layers are to be formed, (4) heat treating the substrate to selectively thermally oxidize the areas on which the field oxide layers are to be formed, using said silicon nitride layer as a mask, and (5) removing the silicon nitride layer formed in the step (1) and the thin thermal oxidation film beneath the silicon nitride layer and then forming a gate insulation layer, a source region and a drain region of [a] *an* MIS device in the N(or P)-type semiconductor substrate and the P(or N)-type well layer.

DESCRIPTION OF THE PREFERRED EMBODIMENT

The method for manufacturing a CMIS FET IC of LOCOS structure of the present invention is now explained in the order of manufacturing steps.

Figure 1:
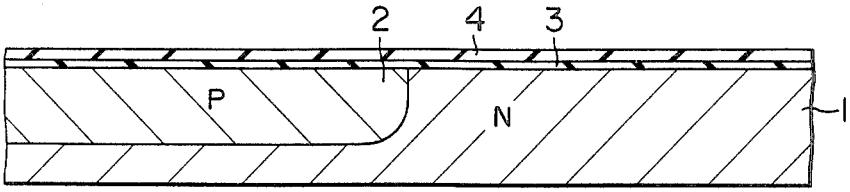
FIGS. 1 through 6 show one embodiment of the present invention illustrating a sequence of steps, in partial sectional views, of manufacturing a semiconductor integrated circuit device comprising a plurality of CMIS FET's of LOCOS structure.

(a) A portion of a surface of an N-type silicon substrate is delimited, in which a P-type well layer 2 of a thickness of about 6–8 μm is formed by ion implantation technique. Thereafter, the surface of the substrate is thermally oxidized in a dry $O_2$ atmosphere at about 1000° C. to form a silicon oxide ($SiO_2$) layer 3 of the thickness of about 700 Å. Then, a silicon nitride ($Si_3N_4$) layer 4 of the thickness of about 1000 Å–1400 Å is formed by vapor reaction on the layer 3. (FIG. 1)

Figure 2:
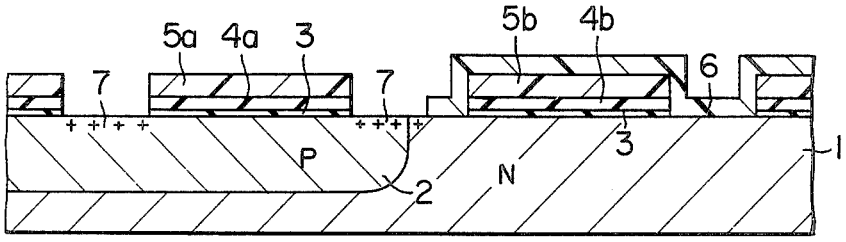

(b) The $Si_3N_4$ layer 4 and the $SiO_2$ layer 3 therebeneath are etched away except at areas 4a and 4b [on which field oxide layers are to be formed], using a photoresist layer 5 (5a and 5b) as a mask. Then, that portion of the surface of the substrate 1 on which a P-channel MOS device is to be formed is covered with a photoresist layer 6, and then boron (B) impurity 7 is ion implanted at 75KeV at that area of the surface of the substrate 1 on which the field oxide layer of the N-channel MOS device is to be formed, using, as a mask, a photoresist layer 6 and the photoresist layer 5a which has been used in etching the $Si_3N_4$ layer 4 and the underlying $SiO_2$ layer 3 that a surface impurity concentration of about $2\times10^{13}$ atoms/cm$^2$ to $5\times10^{13}$ atoms/ cm$^2$ is obtained at the said area. (FIG. 2)

Figure 3:
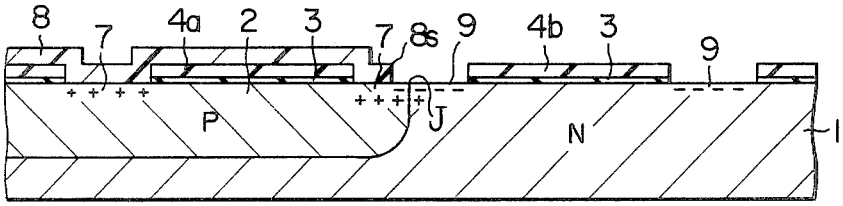

(c) After removing the photoresist layers 5 and 6, a new [photoresists] photoresist layer 8 is selectively formed on that portion of the surface of the substrate 1 in which the N-channel MOS device is to be formed. Then, using the selectively formed photoresist layer 8 and the silicon nitride ($Si_3N_4$) layer under which the P-channel MOS device is to be formed as a mask, phosphorus (P) impurity 9 is ion implanted at 45KeV in that portion of the surface of the substrate 1 on which the field oxide layer of the P-channel MOS device is to be formed. (FIG. 3) The ion implantation energy of 45KeV for the phosphorus impurity is enough to obtain an area of a sufficiently high surface impurity concentration. On the other hand, with the acceleration energy of below 60KeV, phosphorus ions can be masked only by the $Si_3N_4$ layer or the $SiO_2$ layer. Accordingly, the photoresist layer need not be maintained on the $Si_3N_4$ layer 4b. This means that the alignment of the mask used in exposing step for the photoresist layer 8 need not be highly accurate. That is, an edge 8S of the photoresist layer 8 may extend beyond a PN junction J between the P-type well layer 2 and the N-type substrate 1.

Figure 4:
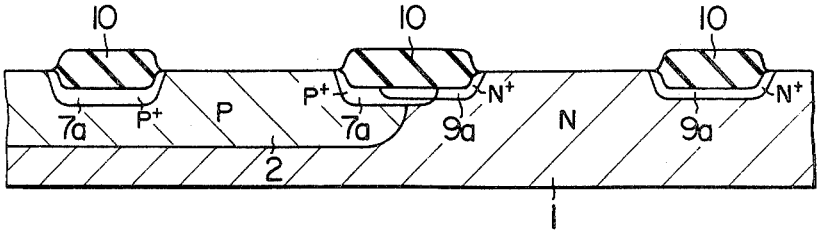

(d) After removing the photoresist layer 8, the substrate 1 is oxidized in a wet oxygen atmosphere at 1000° C. for about 7.5 hours to form *a* selective silicon oxide ($SiO_2$)[layers] *layer* 10 of a thickness of about 1.4 μm of LOCOS structure (FIG. 4). In this case, because of the masking action of the $Si_3N_4$ layer 4 to the oxygen, silicon oxide ($SiO_4$) layer is not formed on the areas covered with the $Si_3N_4$ layer 4. Then, the selective oxidation mask of the $Si_3N_4$ layer 4 and the underlying thin $SiO_2$ layer 3 are removed (FIG. 4).

Through the heat treatment for forming the thick $SiO_2$ [layers] *layer* 10 of the LOCOS structure, the impurities which have been ion implanted in the previous step are activated and diffused so that $P^+$-type field diffusion [layers] *layer* 7a and $N^+$-type field diffusion [layers] *layer* 9a, which act as parastic channel stopper layers, are formed (FIG. 4).

Figure 5:
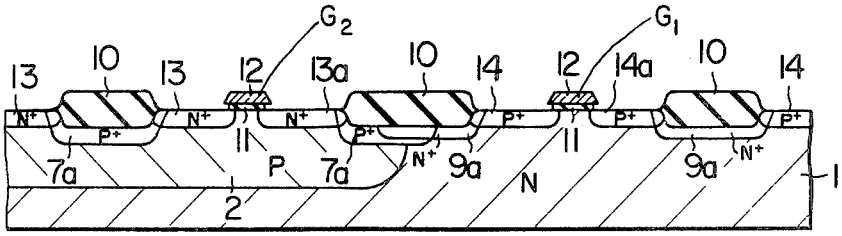

(e) On the surface of the substrate 1, gate oxide layers 11 of a thickness of about 1000 Å are formed in a dry $O_2$ atmosphere at 1000° C. Then, on the surfaces of the gate oxide layers 11, *a* polycrystalline silicon[layers] *layer* 12 [are] *is* deposited to a thickness of about 3500 Å. the polycrystalline silicon[layers are] *layer is* then etched away by photoetching except those areas which are to act as gate electrodes *12*. Etching is again carried out using the remaining polycrystalline silicon layers 12 as a mask to remove the gate oxide layers 11 on the source and drain regions. The drain regions 13, 14 and the source regions 13a, 14a of the MOS devices are then formed using the thick field oxide layers 10 and the polycrystalline silicon layers 12 as a mask (FIG. 5).

The formation of the drain regions 13, 14[a ] and the source regions 13a, 14*a* of the P-channel and N-channel MOS devices, respectively, is explained in more detail. A photoresist layer is formed on an area in which the N-channel MOS device is to be formed. Those portions of the gate oxide layer 11 which correspond to the source and drain regions of the P-channel MOS device are removed. Then, [phosphorus] *boron* impurity is diffused in the exposed surface of the substrate 1 using the polycrystalline silicon layer 12 for the gate electrode $G_1$ and portions of the field oxide [layers] *layer* 10 as a diffusion mask, to form the source region 14*a* and the drain region 14[a]. In this manner, the P-channel MOS device is formed. Then, the photoresist layer is removed and new photoresist [layers are] *layer is* formed on the source region 14*a* and the drain region 14[a] and the portions of the gate oxide layer 11 which correspond to the source and drain regions of the N-channel MOS device are removed. Thereafter, using the polycrystalline silicon layer 12 for the gate electrode $G_2$ of the [P] *NP*-channel MOS device and the portions of the field oxide layer 10 as a diffusion mask, [boron] *phosphorus* impurity is diffused to form the source region 13a and the drain region 13.

Figure 6:
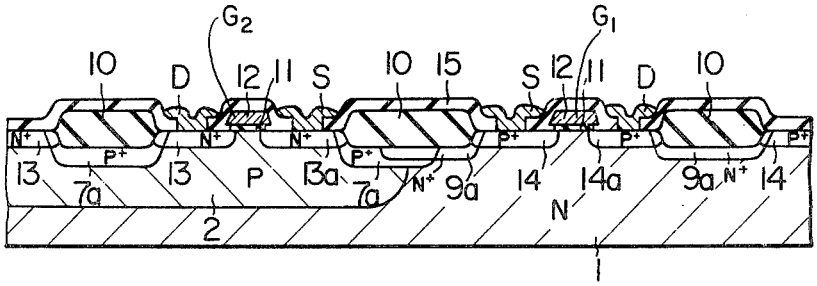

(f) To insulate the polycrystalline silicon layers 12 for the gates [G] $G_1$ *and* $G_2$, a silicon oxide ($SiO_2$) layer 15 is deposited on the surface of the substrate by thermal decomposition of silane ($SiH_4$) (FIG. 6). A PSG (phosphosilicate glass) layer is preferable as an insulating layer to insulate the polycrystalline silicon layers 12 for the gate electrodes [G] $G_1$ *and* $G_2$. Then, after forming windows for contacts, an aluminum layer of a thickness of 1 $\mu$m is formed by vacuum deposition and required aluminum wiring patterns as well as source electrodes S and drain electrodes D are formed by a conventional photoetching process (FIG. 6).

(g) The wafer treatment process is thus completed. Thereafter it is sliced into chips in a conventional manner, and they are assembled into devices.

The present method for manufacturing the CMIS FET's of the LOCOS structure described hereinabove has the following features.

(1) Since the field diffusion layers 7a and 9a having impurity concentrations higher than that of the substrate 1 or the P-type well layer 2 and selected independently of those impurity concentrations are formed under the thick $SiO_2$ layer 10 which act as the field oxide layer, the threshold voltage $V_{th}$ of the parastic MOS transistor in the region of the field oxide layer 10 can be controlled to any value by adjusting the amount of ion implantation, and it can be set independently of the threshold voltages $V_{th}$ of the substrate 1 and the P-type well layer 2. Therefore, according to the present invention, it is possible to manufacture CMIS FET's and semiconductor integrated circuit devices comprising a number of CMIS FET's having difference operating voltages in the same manufacturing process.

(2) In the formation of the field diffusion layers 7a and 9a, the $Si_3N_4$ layer 4 which serves as the mask in forming the thick field silicon oxide layer 10 by the thermal oxidation is used in situ. Therefore, the field diffusion layers 7a and 9a are self-aligned with the field silicon oxide layer 10 and the sources and drains of the devices resulting in a high integration density. Thus, the semiconductor device of the present invention can be manufactured in a very simple way.

(3) Because of the CMIS semiconductor device of the LOCOS structure, fine processing is possible. Furthermore the performance of the device is high in that it provides a high operation speed and a low power consumption. Therefore, the CMIS FET's of the present invention can be applied to various products.

(4) Since the P-type well layer is formed before the formation of the field oxide layer, it is possible to form the field oxide layer in the well layer. Thus, when it is desired to form a plurality of MOS FET's in the well layer, the design of the layouts of the MOS FET's and the wiring layers therefor is facilitated. Furthermore, the source and drain regions can be readily formed using the field oxide 171 layers] *layer* in the well layer as the mask.

In ion implanting the impurity in the above embodiment, the thin $SiO_2$ layer 3 under the $Si_3N_4$ layer 4 is removed to expose the surfaces of the N-type substrate 1 and the P-type well layer 2. However, the thin $SiO_2$ layer 3 may be left unremoved. In this case, less defects on the surfaces of the N-type substrate 1 and the P-type well layer 2 due to the ion damage take place and the affect by the contamination is minimized because the surfaces are not exposed. Furthermore, by the presence of the thin $SiO_2$ layer 3, bird-beaks do not grow. That is, when the thin $SiO_2$ layer 3 is etched away, the parts of the $SiO_2$ layer 3 under the $Si_3N_4$ layers 4a and 4b, which are called overhung, are also etched away. As a result, lateral oxidation proceeds more rapidly resulting in the growth of the bird-beaks. On the other hand, when the thin $SiO_2$ layer 3 is left unremoved, the bird-beaks are grown less slowly so that the area occupied by the field oxide layers is minimized resulting in the increase in the integration density.

In the above embodiment, the parastic channel stopper layers (field diffusionlayers) are formed under the field oxide layers formed in the P-type well layer and the substrate. In this case, the operating voltage of up to about 50 volts is permitted. On the other hand, if the semiconductor integrated circuit device manufactured by the present method is to be used at the operating voltage of less than 10 volts, the phosphorus ion implantation shown in FIG. 3 may be omitted, because if the $V_{th}$ of the P-channel MOS FET is 0.45 volts the $V_{th}$ of the N-type parastic channel is as high as 12 volts or higher and it is not readily inverted at the opening voltage of below 10 volts.

It should be understood that the present invention is not limited to the embodiment described above but it can be applied to the CMIS FET's of the LOCOS structure having various gate electrodes or gate insulation layers and the semiconductor integrated circuit devices comprising such CMIS FET's.

We claim:

1. A method for manufacturing complementary insulated gate field effect transistors comprising the steps of:

(a) delimiting a portion of a surface of a semiconductor substrate of a first conductivity type and forming therein a well layer of a second conductivity type, forming a thin insulating layer over the entire surface thereof and then forming a silicon nitride layer over the entire surface thereof;

(b) etching away said silicon nitride layer at least [those areas on] *in an area in* which a field oxide [layers are] *layer is* to be formed;

(c) introducing *an* impurity of the second conductivity type at that area in said well layer of the second conductivity type on which the field oxide layer is to be formed;

(d) heat treating the substrate to selectively thermally oxidize the areas on which the field oxide [layers are] *layer is* to be formed, using said silicon nitride layer as a mask to form a thick field oxide layer; and (e) removing the silicon nitride layer and the underlying thin insulating layer formed in said step (a), selectively forming gate insulation layers and silicon layers on the exposed substrate and well layer, *and* forming source regions and drain regions of [MIS devices] *insulated gate field effect transistors* in said semiconductor substrate of the first conductivity type and the well layer of the second conductivity type using said silicon layers and said thick field oxide [layers] *layer* as masks[, and forming diffusion layers of desired impurity concentrations beneath said thick field oxide layers].

2. A method for manufacturing complementary insulated gate field effect transistors according to claim 1 wherein said step (b) includes a sub-step of etching away the thin insulating layer under the [siliocn] *silicon* nitride layer.

3. A method for manufacturing complementary insulated gate field effect transistors according to claim 2 wherein said thin insulating layer is a thermal oxidation layer.

4. A method for manufacturing complementary insulated gate field effect transistors according to claim 1 wherein in said step (c) said impurity of the second conductivity type is introduced, by ion implantation, into those areas of the well layer of the second conductivity type on which the field oxide [layers are] *layer is* to be formed.

5. A method for manufacturing complementary insulated gate field effect transistors comprising the steps of:

(a) delimiting a portion of a surface of an N-type semiconductor substrate and forming a P-type well layer therein, forming a thin thermal oxidation layer over the surface thereof and then forming a silicon nitride [film] *layer* over the surface thereof;

(b) etching away said silicon nitride layer at those areas on which a field oxide [layers are] *layer is* to be formed;

(c) ion implanting donor and acceptor impurities into those areas in said N-type semiconductor substrate and the P-type well layer, respectively, on which the field oxide [layers are] *layer is* to be formed, using a portion of said silicon nitride layer as a mask;

(d) heat treating the substrate to selectively thermally oxidize those areas on which the field oxide [layers are] *layer is* to be formed, using said silicon nitride layer as a mask for forming the field oxide [layers] *layer* of LOCOS structure; and (e) removing said silicon nitride layer and the underlying thin thermal oxidation layer formed in said step (a), selectively forming gate insulation layers and semiconductor layers on the exposed N-type substrate and exposed P-type well layer, forming source regions and drain regions of [MIS devices] *insulated gate field effect transistors* in said N-type semiconductor substrate and said P-type well layer using said semiconductor layers and said field oxide [layers] *layer* as masks.

6. A method for manufacturing complementary insulated gate field effect transistors according to claim 5 wherein in said step (c) the donor is phosphorus and the acceptor is boron.

7. A method for manufacturing complementary insulated gate field effect transistors comprising the steps of:

(a) delimiting a portion of a surface of an N(P)-type semiconductor substrate and forming a P(N)-type well layer therein, forming a thin thermal oxidation layer over the entire surface thereon, and then forming a silicon nitride layer over the entire surface thereof;

(b) etching away said silicon nitride layer and the underlying thin thermal oxidation layer at those areas on which *a* field oxide [layers are] *layer is* to be formed;

(c) ion implanting [acceptor (donor) or] donor (acceptor) impurity in the exposed surface area of the substrate [in the area of N(P) channel of P(N) channel device];

(d) ion implanting [donor (acceptor) or] acceptor (donor) impurity in the exposed surface area [of the substrate in the area of P(N) channel of N(P)channel device] *of the well layer;*

(e) heat treating the substrate to selectively thermally oxidize the exposed surface areas of the substrate *and the well layer* using said silicon nitride layer as a mask to form *a* thick field oxide [layers] *layer*; and (f) removing the silicon nitride layer and the underlying thin thermal oxidation layer formed in the step (a), selectively forming gate insulation layers and silicon layers on the exposed surface area of the substrate and well layer, *and* forming source regions and drain regions of the respective [MIS devices] *insulated gate field effect transistors* using said silicon layers and said thick field oxide [layers] *layer* as masks[, and forming diffusion layers of desired impurity concentrations under said field oxide layers].

8. A method for manufacturing a semiconductor integrated circuit device including complementary insulated gate field effect transistors comprising the steps of:

(a) delimiting a portion of a surface of an N-type silicon substrate and forming a P-type well layer therein by ion implantation, forming a silicon dioxide layer over the entire surface thereof and then forming a silicon nitride layer over the entire surface thereof;

(b) selectively forming a first photoresist layer on said silicon nitride layer over said N-type silicon substrate and said P-type well layer;

(c) etching away said silicon nitride layer and the underlying silicon [nitride] *dioxide* layer using said first photoresist layer as a mask to expose surfaces of said N-type silicon substrate and said P-type well layer;

(d) covering the exposed N-type silicon substrate surface with a second photoresist layer;

(e) ion implanting an acceptor impurity into the exposed surface area of said P-type well layer using said first photoresist layer as a mask;

(f) removing said first and second photoresist layers and covering the exposed surface of said P-type well layer with a third photoresist layer;

(g) ion implanting a donor impurity into the exposed surface area of said N-type silicon substrate using said silicon nitride as mask;

(h) removing said third photoresist film and selectively thermally oxidizing the exposed surfaces of said P-type well layer and said N-type silicon substrate using said silicon nitride layer as a a mask to form *a* thick field silicon dioxide [layers] *layer;*

(i) etching away said silicon nitride layer and the underlying silicon dioxide layer to expose said P-type well layer and said N-type silicon substrate;

(j) oxidizing the exposed surfaces of said P-type well layer and said N-type silicon substrate to form gate silicon dioxide layers;

(k) forming *a* silicon [layers] *layer* over *the* entire surfaces of said field silicon dioxide [layers] *layer* and said gate silicon dioxide layers;

(l) selectively etching away said silicon [layers] *layer* and said gate silicon dioxide layers to expose the surfaces of said N-type silicon substrate and said P-type well layer;

(m) diffusing an acceptor impurity into the exposed N-type silicon substrate and a donor impurity into the exposed P-type well layer using the remaining silicon layer and said field silicon dioxide [layers] *layer* as masks to form source regions and drain regions, respectively, and (n) connecting aluminum layers to said source regions and drain regions formed in said N-type silicon substrate and said P-type well layer, respectively.

*9. A method for manufacturing a semiconductor device including insulated gate field effect transistors, comprising the steps of:*

*(a) forming a silicon substrate containing a well region of one conductivity type extending to a major surface of the substrate, and a substrate region of another conductivity type adjoining said well region and extending to said major surface;*

*(b) covering said major surface of the substrate with an oxidation-resistive material to cover selected surface areas of said well and substrate regions and leave other surface area portions of said well and substrate regions uncovered with said oxidation-resistive material;*

*(c) introducing a first impurity determining said one conductivity type into the uncovered surface area portions of said well region;*

*(d) subjecting the combination thus obtained to an oxidation treatment to selectively oxidize portions of said substrate which are not covered with said oxidation-resistive material thereby to form a relatively thick silicon oxide layer having a plurality of openings at said selected surface areas;*

*(e) removing said oxidation-resistive material from said substrate;*

*(f) forming relatively thin silicon oxide layers on said selected surface areas in said openings; and*

*(g) forming at said selected surface areas in said openings insulated gate field effect transistors using said relatively thin silicon oxide layers as gate insulators.*

*10. The method of claim 5 or 7, wherein the heat treating of the substrate is performed at a temperature sufficient to form diffusion layers of desired impurity concentrations beneath said thick field oxide layer.*

*11. The method of claim 1, wherein, in step (b), the silicon nitride layer is etched without etching away the thin insulating layer, whereby steps (c) and (d) are performed without exposure of the substrate and well layer.*

*12. The method of claim 5, wherein, in step (b), the silicon nitride layer is etched without etching away the thin thermal oxidation layer, whereby steps (c) and (d) are performed without exposure of the substrate and well layer.*

*13. The method of claim 8, wherein the selectively thermally oxidizing the exposed surfaces of the P-type well layer and the N-type silicon substrate is performed at a temperature sufficient to form diffusion layers of desired impurity concentrations beneath the thick field silicon dioxide layer.*

*14. The method of claim 9, wherein said oxidation-resistive material is silicon nitride.*

*15. The method of claim 9, further comprising the steps of:*

*(c1) introducing a second impurity determining said other conductivity type into the uncovered surface area portions of said substrate region between the step (b) and the step (d);*

*(d1) then carrying out said step (d) thereby to form channel stopper regions underneath said relatively thick silicon oxide layer.*

*16. The method of claim 15, wherein said first impurity is introduced by ion implantation while covering the openings other than those reaching said well region with a photoresist material, and said second impurity is introduced by ion implantation while covering the openings other than those reaching said substrate region with a photoresist material.*

*17. A method for manufacturing a semiconductor integrated circuit device including circuit elements, comprising the steps of:*

*(a) forming a silicon substrate containing a well region of one conductivity type extending to a major surface of the substrate and a substrate region of another conductivity type adjoining said well region and extending to said major surface;*

*(b) covering said major surface of the substrate with an oxidation-resistive mask, said mask having a plurality of islands of an oxidation-resistive material which cover the surface of said well region other than selected surface areas in the midst, as well as in the periphery, of the surface of the well region;*

*(c) introducing an impurity determining said one conductivity type into the selected surface areas of said well region;*

*(d) subjecting the combination thus obtained to an oxidation treatment to selectively oxidize portions of said major surface of the silicon substrate which are not covered with said mask, thereby to form a relatively thick silicon oxide layer which includes a plurality of first openings located at portions of said well region corresponding to said islands of said oxidation-resistive material and second openings located on the surface of said substrate region;*

*(e) removing said oxidation-resistive mask from the major surface of said substrate;*

*(f) forming relatively thin silicon oxide layers covering the surface portions of said well and substrate regions at said first and second openings; and*

*(g) forming circuit elements at surface portions of said well and substrate regions in said first and second openings.*

*18. The method of claim 17, wherein said oxidation-resistive material comprises silicon nitride.*

*19. The method of claim 17 or 18, wherein said circuit elements are insulated gate field effect transistors.*

*20. A method for manufacturing a semiconductor device including insulated gate field effect transistors, comprising the steps of:*

*(a) forming a silicon substrate containing a well region of one conductivity type extending to a major surface of the substrate, and a substrate region of another conductivity type adjoining said well region, underlying said well region and extending to said major surface;*

*(b) covering said major surface of the substrate with an oxidation-resistive material to cover selected areas of said well and substrate regions;*

*(c) introducing an impurity determining said other conductivity type into the selected surface areas of said substrate region;*

*(d) subjecting the combination thus obtained to an oxidation treatment to selectively oxidize portions of said substrate and well regions which are not covered with said oxidation-resistive material so as to form a rela-*

*tively thick silicon oxide layer having a plurality of openings at said selected surface areas and so as not to reach portions of said substrate region underlying said well region;*

(*e*) *removing said oxidation-resistive material from said substrate;*

(*f*) *forming relatively thin silicon oxide layers on said selected surface areas in said openings; and*

(*g*) *forming at said selected surface areas in said openings insulated gate field effect transistors using said relatively thin silicon oxide layers as gate insulators.*

*21. The method of claim 9, 17 or 20, wherein said relatively thin silicon oxide layers have a thickness of about 1000 Å.*

*22. The method of claim 9, 17 or 20, wherein said oxidation treatment is performed at a temperature of about 1000° C.*

*23. The method of claim 22, wherein said relatively thin silicon oxide layers have a thickness of about 1000 Å.*

*24. The method of claim 22, wherein said relatively thick silicon oxide layer formed has a thickness of about 1.4 μm.*

*25. The method of claim 24, wherein said relatively thin silicon oxide layers have a thickness of about 1000 Å.*

*26. The method of claim 9, 17 or 20, wherein said relatively thick silicon oxide layer formed has a thickness of about 1.4 μm.*

*27. The method of claim 26, wherein said relatively thin silicon oxide layers have a thickness of about 1000 Å.*

*28. The method of claim 9, 15, 16, 14 or 20, wherein prior to step (b), said major surface of the substrate is covered with a thin insulating layer.*

*29. The method of claim 28, wherein said thin insulating layer is a thermal oxidation layer.*

* * * * *